(12) United States Patent
Hashimoto

(10) Patent No.: US 10,739,386 B2
(45) Date of Patent: Aug. 11, 2020

(54) STORAGE BATTERY MONITORING DEVICE

(71) Applicant: NEC Corporation, Tokyo (JP)

(72) Inventor: Yasushi Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/571,678

(22) PCT Filed: May 17, 2016

(86) PCT No.: PCT/JP2016/002403
§ 371 (c)(1),
(2) Date: Nov. 3, 2017

(87) PCT Pub. No.: WO2016/185711
PCT Pub. Date: Nov. 24, 2016

(65) Prior Publication Data
US 2019/0128929 A1 May 2, 2019

(30) Foreign Application Priority Data
May 21, 2015 (JP) .................. 2015-103592

(51) Int. Cl.
*H02J 7/00* (2006.01)
*G01R 19/165* (2006.01)
(Continued)

(52) U.S. Cl.
CPC .......... *G01R 19/165* (2013.01); *G01R 31/36* (2013.01); *G01R 31/382* (2019.01); *H01M 10/48* (2013.01); *H02H 7/18* (2013.01); *H02J 7/00* (2013.01)

(58) Field of Classification Search
USPC ....................................................... 320/134
See application file for complete search history.

(56) References Cited

U.S. PATENT DOCUMENTS 5,498,984 A * 3/1996 Schaffer ............ G01R 19/0092
327/28
2005/0286200 A1 12/2005 Ohshima
(Continued)

FOREIGN PATENT DOCUMENTS

EP 1608065 A2 12/2005
JP H02-134553 A 5/1990
(Continued)

OTHER PUBLICATIONS

International Search Report corresponding to PCT/JP2016/002403 dated Jul. 12, 2016 (2 pages).

*Primary Examiner* — Samuel Berhanu
(74) *Attorney, Agent, or Firm* — Wilmer Cutler Pickering Hale and Dorr LLP

(57) ABSTRACT

The present invention distinguishes between short-circuit current and inrush current and only enables a protection function for short-circuit current. A storage battery monitoring device is provided with a current detection means for detecting charge/discharge current from a storage battery, a differentiating circuit for determining the current variation rate of the charge/discharge current, and a comparison means for outputting a signal according to whether the current variation rate of the charge/discharge current is larger than a preset threshold voltage. The threshold voltage is set to a value larger than the current variation rate for inrush current and smaller than that for short-circuit current.

5 Claims, 5 Drawing Sheets

(51) Int. Cl.
*H01M 10/48* (2006.01)
*H02H 7/18* (2006.01)
*G01R 31/36* (2020.01)
*G01R 31/382* (2019.01)

(56) References Cited

U.S. PATENT DOCUMENTS

2015/0109020 A1\* 4/2015 Morino .............. G01R 19/0092
　　　　　　　　　　　　　　　　　　　　324/764.01
2016/0341776 A1\* 11/2016 Sekine .................... H02M 1/32

FOREIGN PATENT DOCUMENTS

| JP | H02-134575 A | 5/1990 |
|----|---|---|
| JP | H10-14086 A | 1/1998 |
| JP | 2004-226185 A | 8/2004 |
| JP | 2006-005581 A | 1/2006 |
| WO | WO-2007/142195 A1 | 12/2007 |

\* cited by examiner (a)

(b)

STORAGE BATTERY MONITORING DEVICE

CROSS-REFERENCE TO RELATED APPLICATIONS

This application is a national stage application of International Application No. PCT/JP2016/002403 entitled "Storage Battery Monitoring Device" filed on May 17, 2016, which claims priority to Japanese Patent Application No. 2015-103592 filed on May 21, 2015, the disclosures of which are hereby incorporated by reference in their entirety.

TECHNICAL FIELD

The present invention relates to a storage battery monitoring device that performs protection against overcurrent of a storage battery.

BACKGROUND ART

While a lithium ion battery has a feature that the current output property is good because it has low impedance, a large current (100 A, for example) flows when a short circuit occurs. For this reason, a sufficient measure against a case where a short circuit occurs to a lithium ion battery is needed. In safety testing about transportation of a battery, a protection test to a short circuit has become indispensable, and measures to a short circuit are very important.

Up to now, a structure in which a switch including an FET (Field effect transistor) and the like is provided has been proposed for the purpose of battery protection and the like against a short circuit. In this structure, when electric current of a value equal to or larger than a value set in advance flows, battery protection is carried out by the switch operating and cutting off the electric current.

However, short-circuit current may exceed 1000 A before the switch cuts off the short-circuit current. Accordingly, the switch needs to have a current limiting capability (permissible current) no smaller than 1000 A. However, a switch of a large permissible current is very expensive and is a factor to largely increase the cost of a device.

About this issue, there is proposed in Patent Literature 1 (PTL1) a technology in which an overcurrent detecting means equipped with a delay circuit is provided, and ON time of a discharge control switch is controlled by the overcurrent detecting means. At that time, the delay circuit has a function to change a delay time continuously (in an analog manner). Then, it is made such that, in response to a sudden change of a state (increase of electric current) in the discharge control switch, the discharge control switch can become OFF state quickly. As a result, a large current is prevented from flowing for a long time in the discharge control switch, and destruction of the discharge control switch is prevented.

Patent Literature 2 (PTL2) relates to charge control of a secondary battery. Proposed is that a voltage between the terminals of a cell of a secondary battery is read and then input to an analog-to-digital converter, and, from an input value from the analog-to-digital converter, a charge control unit performs a protection operation, such as blocking off of an FET interposed in the charge path and so on, against abnormality such as a short circuit between the terminals and the like.

Patent Literature 3 (PTL3) relates to a detecting device of a short-circuit flaw in an electroplating line for a steel plate. Since, when a short-circuit flaw occurs to a steel plate in electroplating, flowing electric current changes rapidly, it is proposed to detect this electric current by a current detection means such as a shunt and the like, differentiate output of the current detection means, and determine by a comparison means whether the differentiated value is within a predetermined scope.

CITATION LIST

Patent Literature

[PTL1] Japanese Patent Application Laid-Open No. 2004-226185
[PTL2] WO2007/142195
[PTL3] Japanese Patent Application Laid-Open No. Hei 2-134553

SUMMARY OF INVENTION

Technical Problem

However, in PTL1, there is an issue that it is difficult to distinguish short-circuit current and inrush current.

That is, short-circuit current and inrush current are large current and is current which increases for a short while together. However, short-circuit current is electric current which is generated by any defect, whereas inrush current is electric current that can be anticipated in the design phase. Accordingly, it is not desirable that a protection function be activated by such inrush current to stop supply of electric power.

Accordingly, a main object of the present invention is to provide a storage battery monitoring device in which short-circuit current and inrush current are distinguished and only a protection function for short-circuit current is made to be operated.

Solution to Problem

To solve the above-mentioned issue, a storage battery monitoring device to perform protection against overcurrent of a storage battery, is characterized in that the storage battery monitoring device includes: a current detection means for detecting charge or discharge current from the storage battery; a differentiating circuit to obtain a current variation rate of the charge or discharge current; and a comparison means for outputting a signal according to whether the current variation rate of the charge/discharge current is larger than a preset threshold voltage, wherein the threshold voltage is set to a numerical value larger than a current variation rate of inrush current and smaller than a current variation rate of short-circuit current.

Advantageous Effect of Invention

According to the present invention, processing such as circuit breaking and the like can be performed accurately only for short-circuit current because short-circuit current and inrush current is distinguished focusing on the fact that current variation rates of charge/discharge current are different greatly between short-circuit current and inrush current.

DESCRIPTION OF EMBODIMENTS

Figure 1:
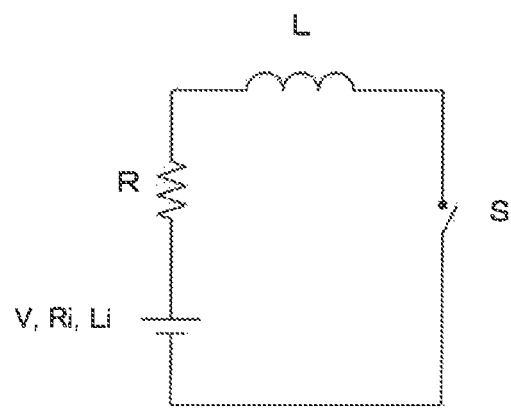
FIG. 1 is a diagram indicating a circuit model at the time of battery short.

Before describing exemplary embodiments of the present invention, a brief summary of the invention will be described. In the present invention, short-circuit protection is performed while distinguishing inrush current and short-circuit current.

As described before, inrush current and short-circuit current can be named as a momentary large current inputted to a switch (breaker) such as an FET and the like. However, there is a difference that, although inrush current is a transient electric current, short-circuit current is an electric current which flows continuously.

When a breaking determination threshold value It is set and electric current exceeds the breaking determination threshold value It, two protection patterns can be considered for electric current when breaking a battery charging and discharging circuit (breaking current), and one is a case aimed at protection from "abnormal operations by such as a failure and an erroneous operation of a device" (a first protection pattern), and a case aimed at protection from "abnormal operations by such as a failure and an erroneous operation of a device, and a short circuit" (a second protection pattern).

(1) The First Protection Pattern: A Case Aimed at Protection from "Abnormal Operations by Such as a Failure and an Erroneous Operation of a Device"

In this protection pattern, when detected electric current exceeds the breaking determination threshold value It, the battery assumes that there has occurred an abnormal operation such as a failure and an erroneous operation of a device. Since detected electric current includes an error, an error margin a is added so as not to determine a case of electric current within the normal range in usual use (normal current) In as an abnormal operation, even including the error. That is, the breaking current Ic satisfies the following equation.

$$Ic \approx It \geq In + \alpha$$

(2) The Second Protection Pattern: A Case Aimed at Protection from "Abnormal Operations by Such as a Failure and an Erroneous Operation of a Device, and a Short Circuit"

This protection pattern is a protection mode in which protection to a short circuit is added to the first protection pattern. Even if electric current beyond the breaking determination threshold value It is detected, a temporal delay exists before performing circuit breaking actually (a first case). However, a similar behavior is also seen for inrush current (a second case). It is desired to make protection operation function only for the first case, eventually. Behaviors in the first case and the second case will be considered.

(2-1) The First Case: A Case where the Time from Detection of Current Beyond the Breaking Determination Threshold Value it to Circuit Breaking is Delayed Let a delay time from detection of current beyond the breaking determination threshold value It to circuit breaking be a circuit breaking delay time Td and a current increase rate at the time of a short circuit be a current increase rate dI/dt.

At that time, the breaking current Ic is given by Ic=It+(dI/dt)×Td. As stated in "The first protection pattern", the breaking determination threshold value It has to be equal to or more than a numerical value made by adding the error margin a to the normal current In, and, thus, it will be as follows.

$$Ic = It + (dI/dt) \times Td \geq In + \alpha + (dI/dt) \times Td$$

(2-2) The Second Case: A Case where Inrush Current Exists

In a lot of loads, large electric current flows temporarily when turning on the power. This current value reaches about 5 to 10 times of that of the normal operation, though it is of a short time of about several milliseconds.

On the occasion of load design, it is desirable to perform design so as not to generate inrush current. However, measures against inrush current is not desired to load design due to an economical reason or the like, and it is often requested to the power supply (battery) side. Of course, inrush current is not generated in an abnormal state of a battery, and, therefore, circuit breaking should not be conducted due to inrush current.

As a method for distinguishing short-circuit current and inrush current to perform breaking control, a method to make the breaking determination threshold value It be larger than the maximum value of inrush current (a first method of settlement), and a method to make the responsiveness of the current detection means be degraded (a second method of settlement) can be illustrated.

(2-2-1) the First Method of Settlement: The Breaking Determination Threshold Value it is Made Larger than the Maximum Value of Inrush Current Although inrush current reaches 5 to 10 times of the current of the normal operation, it is smaller than the saturation current at the time of a short circuit (a current value when short-circuit current is stabilized). Accordingly, when the breaking determination threshold value It of a numerical value larger than an assumed maximum value of inrush current is set, only short-circuit current can be detected without detecting inrush current.

A maximum value Ir_max of inrush current is expressed as follows.

$$Ir\_max = \beta \times Ic$$

where, β is a numerical value of from 5 to 10, and hereinafter it is described as an inrush current coefficient.

Accordingly, the breaking determination threshold value It is set so as to satisfy the following equation.

$$It \geq Ir\_max + \alpha \geq \beta \times Ic + \alpha$$

When influence of the circuit breaking delay time Td is taken into account, the breaking current Ic should just be set so as to satisfy the following equation.

$$Ic = It + (dI/dt) \times Td \geq Ir\_max + \alpha + (dI/dt) \times Td$$
$$= \beta \times Ic + \alpha + (dI/dt) \times Td$$

(2-2-2) the Second Method of Settlement: The Responsiveness of the Current Detection Means is Made to be Degraded Generally, inrush current converges within a limited time of about several milliseconds (inrush current duration). Accordingly, a time taken for current detection is made longer than this inrush current duration. As a result, a current detection means cannot detect inrush current and comes to detect only short-circuit current.

However, in the second method of settlement, since a detected current I keeps increasing during a determination time delay Ti that is a delay of determination time after the breaking determination threshold value It has been reached until being judged to be abnormal, the detected current I at the time of determination will be as follows.

$$I = It + (dI/dt) \times Ti$$

Accordingly, the breaking current Ic to which influence of the determination time delay Ti from current detection to circuit breaking is taken into account will be as follows.

$$Ic = It + (dI/dt) \times Ti + (dI/dt) \times Td$$
$$= It + (dI/dt) \times (Ti + Td) \geq Ic + \alpha + (dI/dt) \times (Ti + Td)$$

As above, when it is made such that protection against both of "a failure and an erroneous operation of a device" and "a short circuit" is performed, but protection to inrush current is not performed, a switch that endures against the larger one of the following breaking currents Ic is needed to be selected.

$$Ic \geq \beta \times Ic + \alpha + (dI/dt) \times Td$$

$$Ic \geq Ic + \alpha + (dI/dt) \times (Ti + Td)$$

However, these breaking currents Ic are large electric current, and the switch will be expensive. Accordingly, in the present invention, short-circuit current and inrush current are distinguished using the current increase rate dI/dt of detected electric current.

Figure 2:
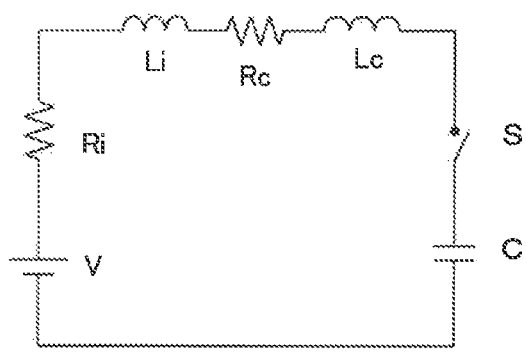
FIG. 2 is a diagram indicating a circuit model for inrush current to a load.

FIG. 1 is a diagram which indicates a circuit model at the time of a battery short circuit. FIG. 2 is a diagram which indicates a circuit model for inrush current to a load.

As shown in FIG. 1, in the circuit model at the time of a short circuit, given that the terminal voltage of the battery is V, the internal resistance is Ri, the internal inductance is Li, and the time when a short circuit has occurred is t=0, the electric current I is $$I = \frac{V}{Ri}\left(1 - e^{-\frac{Ri}{Li}t}\right) \quad (1)$$

expressed in Equation 1.

Here, the current increase rate dI/dt is $$\frac{dI}{dt} = -\frac{Ri}{Li}\frac{V}{Ri}(-e^{-\frac{Ri}{Li}t}) = \frac{V}{Li}e^{-\frac{Ri}{Li}t} \quad (2)$$

expressed in Equation 2.

The current increase rate dI/dt at the time of occurrence of short circuit (t=0) is $$\left.\frac{dI}{dt}\right|_{t=0} = \frac{V}{Li} \quad (3)$$

expressed in Equation 3.

On the other hand, in the circuit model of inrush current illustrated in FIG. 2, given that the resistance of the wiring is Rc, the inductance is Lc and the capacity of the load is C, the electric current I at the time of turning on the power (t=0) is $$I = \frac{V}{\sqrt{R^2 - 4\frac{L}{C}}}\left(e^{\frac{-R+\sqrt{R^2-4\frac{L}{C}}}{2L}t} - e^{\frac{-R-\sqrt{R^2-4\frac{L}{C}}}{2L}t}\right) \quad (4)$$

expressed in Equation 4. Here, the resistance R is R=Ri+Rc and the inductance L is L=Li+Lc.

On the other hand, the current increase rate dI/dt is $$\frac{dI}{dt} = \frac{V}{\sqrt{R^2 - 4\frac{L}{C}}}\left(\left(\frac{-R+\sqrt{R^2-4\frac{L}{C}}}{2L}\right)e^{\frac{-R+\sqrt{R^2-4\frac{L}{C}}}{2L}t} - \left(\frac{-R-\sqrt{R^2-4\frac{L}{C}}}{2L}\right)e^{\frac{-R-\sqrt{R^2-4\frac{L}{C}}}{2L}t}\right) \quad (5)$$

expressed in Equation 5.

Accordingly, the current increase rate dI/dt at the time of turning on the power (t=0) is $$\left.\frac{dI}{dt}\right|_{t=0} = \frac{V}{\sqrt{R^2 - 4\frac{L}{C}}}\left(\left(\frac{-R+\sqrt{R^2-4\frac{L}{C}}}{2L}\right) - \left(\frac{-R-\sqrt{R^2-4\frac{L}{C}}}{2L}\right)\right)$$

$$= \frac{V}{\sqrt{R^2 - 4\frac{L}{C}}} \cdot \frac{2\sqrt{R^2-4\frac{L}{C}}}{2L}$$

$$= \frac{V}{L}$$

$$= \frac{V}{Li + Lc} \quad (6)$$

indicated in Equation 6.

Figure 3:
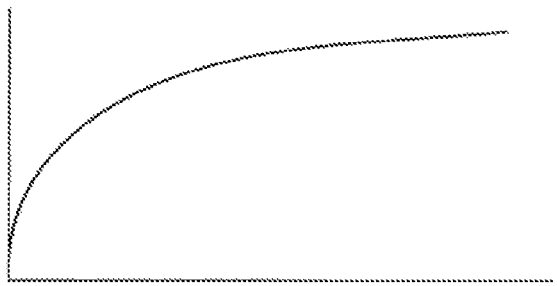
FIG. 3 is a diagram indicating a current variation rate of short-circuit current, and (a) is a current waveform and (b) is a diagram which illustrates a waveform of a current increase rate dI/dt.
Figure 3:
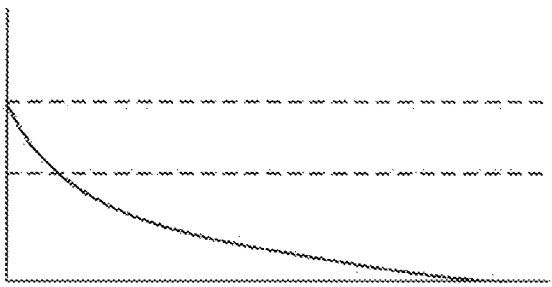
Figure 4:
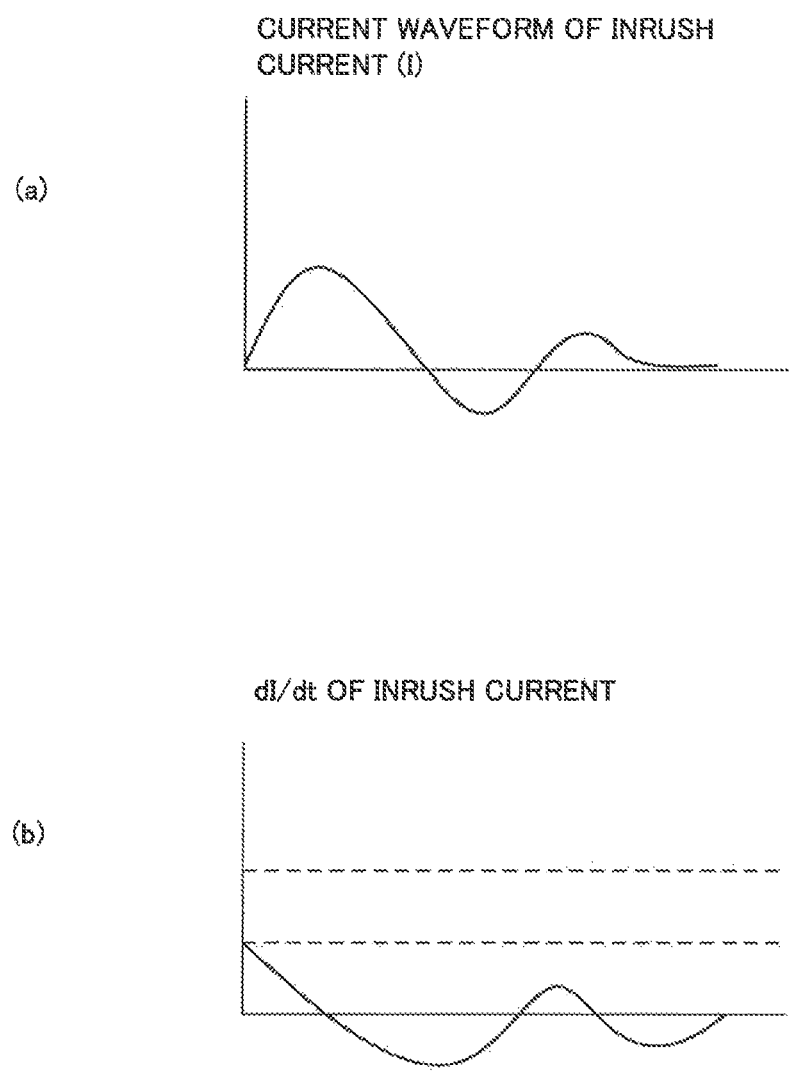
FIG. 4 is a diagram indicating a current variation rate of inrush current, and (a) is a diagram illustrating a current waveform and (b) illustrates a waveform of the current increase rate dI/dt.
Figure 5:
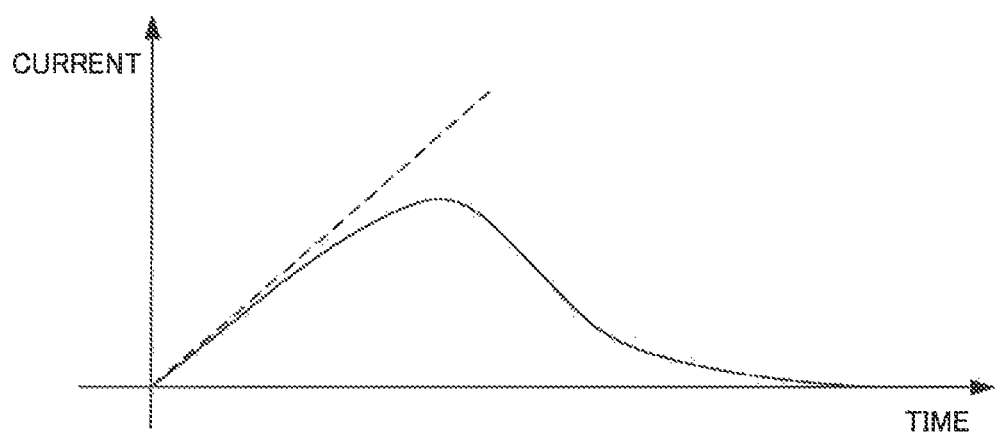
FIG. 5 is an expanded diagram of the rising of inrush current and short-circuit current.

Generally, since the internal inductance Li of a battery is very small (Lc>>Li), the current increase rate dI/dt is greatly different between short-circuit current and inrush current. FIG. 3 is a diagram which indicates a current variation rate of short-circuit current, and (a) is a diagram illustrating a current waveform and (b) is a diagram illustrating a waveform of the current increase rate dI/dt. FIG. 4 is a diagram which indicates a current variation rate of inrush current, and (a) is a diagram illustrating a current waveform and (b) is a diagram illustrating a waveform of the current increase rate dI/dt. Furthermore, FIG. 5 is an expanded diagram of rising of inrush current and short-circuit current. In FIG. 5, the dotted line indicates short-circuit current and the solid line inrush current.

As it may be understood from FIGS. 3 to 5, at the time of turning on the power (t=0), the current increase rate dI/dt of short-circuit current is larger than that of inrush current. Therefore, according to the magnitude of the current increase rate dI/dt, short-circuit current and inrush current can be distinguished.

Figure 6:
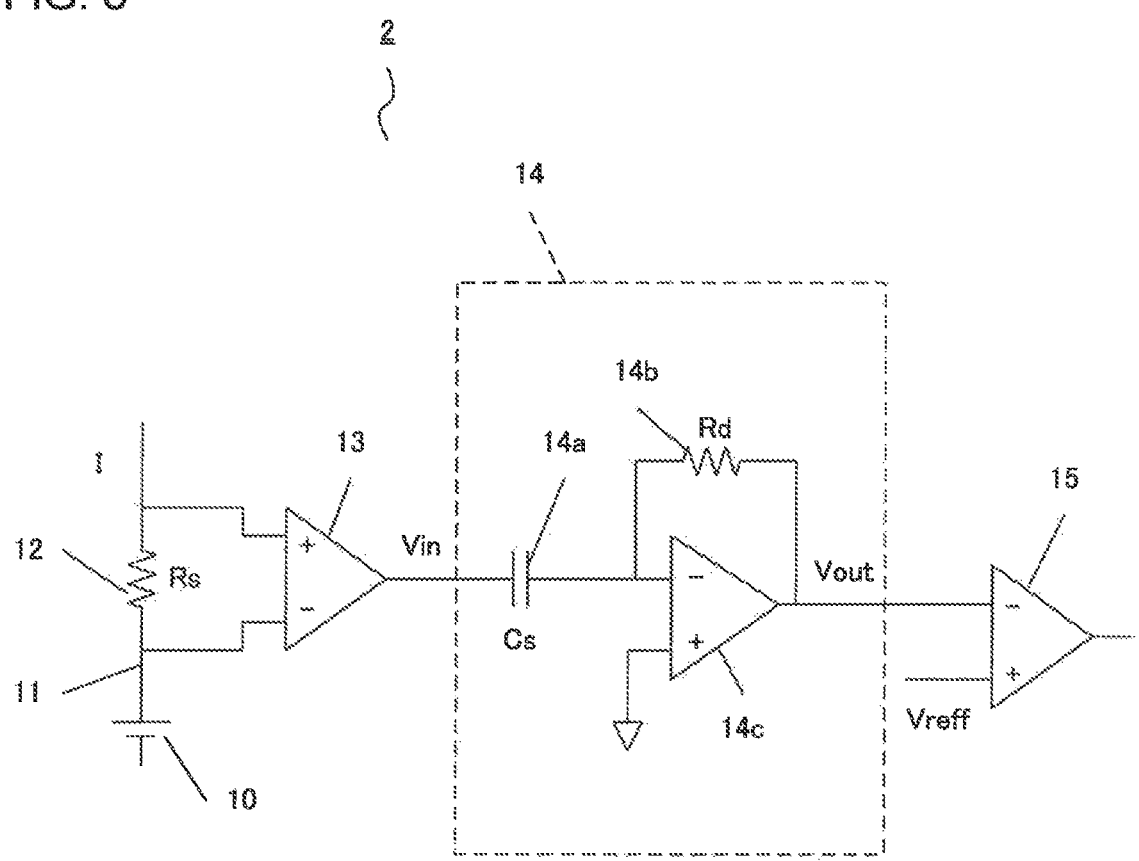
FIG. 6 is a diagram illustrating a block diagram of a storage battery monitoring device 2.

A block diagram of the storage battery monitoring device 2 according to an exemplary embodiment of the present invention made according to such principle is illustrated in FIG. 6. A power line 11 is connected to a terminal of a battery 10, and a shunt resistance (current detection means) 12 is connected to the power line 11. Since an electric potential difference according to the magnitude of the electric current I occurs between the both ends of the shunt resistance 12, differential amplification of this electric potential difference is performed in an operational amplifier (amplifying means) 13. An output of the operational amplifier 13 is an input of a well-known differentiating circuit 14 that includes a capacitor 14a, a resistance 14b and an operational amplifier 14c.

At that time, given that the input voltage of the differentiating circuit 14 is Vin, the capacitance of the capacitor 14a is Cs, and the resistance value of the resistance 14b is Rd, the voltage Vout expressed in Vout=−Rd×Cs×(dVin/dt) is output from the operational amplifier 14c.

Then, the output voltage Vout of this differentiating circuit 14 is input to one terminal of a comparator (comparison means) 15. A fixed threshold voltage (Vreff) set in advance is being input to the other terminal of the comparator 15.

As a result, the comparator 15 outputs a signal whose polarity is reversed according to whether the voltage Vout is larger than the threshold voltage Vreff. Accordingly, by setting, as the threshold voltage Vreff, the current increase rate dI/dt of inrush current in advance, inrush current and short-circuit current can be distinguished.

In particular, since distinction between inrush current and short-circuit current can be determined while a current value is still small, the energy needed at the time of breaking electric current (it is proportional to a square of a current value) is small. When an FET is used for circuit breaking, this means that an FET of a small permissible current is acceptable, and thus cost increase can be suppressed.

Meanwhile, in the above-mentioned description, although a case in which an analog differentiating circuit is used has been described, the differentiating circuit may be composed of a digital circuit. In this case, a current value is sampled periodically using an AD converter. Given that the sampling period at that time is τ, the current increase rate can be obtained as dI/dt={I(t)−I(t−τ)}/τ.

In addition, although electric current has been detected using a shunt resistance as a current detection means, it is not limited to this, and a publicly known current detection means such as a clamp meter and the like can be used.

As above, the present invention has been described taking the exemplary embodiment mentioned above as an exemplary example. However, the present invention is not limited to the exemplary embodiment mentioned above. That is, various aspects which a person skilled in the art can understand can be applied to the present invention within the scope of the present invention.

This application is based upon and claims the benefit of priority from Japanese Patent Application No. 2015-103592, filed on May 21, 2015, the disclosure of which is incorporated herein in its entirety by reference.

REFERENCE SIGNS LIST

2 Storage battery monitoring device
10 Battery
11 Power line
12 Shunt resistance (current detection means)
13 Operational amplifier (amplifying means)
14 Differentiating circuit
14a Capacitor
14c Operational amplifier
14b Resistance
15 Comparator (comparison means)

The invention claimed is:

1. A storage battery monitoring device to perform protection against overcurrent of a storage battery, comprising:
    a current detection unit that detects charge or discharge current from the storage battery;
    a differentiating circuit configured to obtain a current variation rate of the charge/discharge current; and
    a comparison unit that outputs a signal according to whether the current variation rate of the charge or discharge current is larger than a preset threshold voltage, wherein
    the threshold voltage is set to a numerical value larger than a change of current variation rate of inrush current and smaller than a change of current variation rate of short-circuit current.

2. The storage battery monitoring device according to claim 1, wherein
    the current detection unit is a shunt resistance to convert the charge/discharge current into an electric potential difference.

3. The storage battery monitoring device according to claim 2, further comprising an amplifying unit that amplifies the electric potential difference generated between both ends of the shunt resistance, wherein
    a signal amplified by the amplifying unit is input to the differentiating circuit.

4. The storage battery monitoring device according to claim 2, wherein the current detection unit is connected to a power line, and the power line is connected to a terminal of the storage battery.

5. The storage battery monitoring device according to claim 4, wherein the current detection unit is connected in series to the storage battery, and detects the charge or discharge current from the storage battery.

* * * * *